US012016147B2

United States Patent
Okuda (10) Patent No.: US 12,016,147 B2
(45) Date of Patent: Jun. 18, 2024

(54) ELECTRICAL DEVICE

(71) Applicant: TOYOTA JIDOSHA KABUSHIKI KAISHA, Toyota (JP)

(72) Inventor: Yuya Okuda, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 246 days.

(21) Appl. No.: 17/765,586

(22) PCT Filed: Oct. 15, 2019

(86) PCT No.: PCT/JP2019/040520
§ 371 (c)(1),
(2) Date: Mar. 31, 2022

(87) PCT Pub. No.: WO2021/074975
PCT Pub. Date: Apr. 22, 2021

(65) Prior Publication Data
US 2022/0338358 A1    Oct. 20, 2022

(51) Int. Cl.
*H05K 7/14* (2006.01)
*H01R 13/629* (2006.01)

(52) U.S. Cl.
CPC ......... *H05K 7/1432* (2013.01); *H01R 13/629* (2013.01)

(58) Field of Classification Search
CPC ...... H01R 2201/26; H01R 31/06; H01R 4/64; H01R 13/10; H01R 13/502; H01R 13/533;
(Continued)

(56) References Cited

U.S. PATENT DOCUMENTS 5,401,179 A * 3/1995 Shinchi ............ H01R 13/62933
439/372
11,276,952 B1 * 3/2022 Zou ........................ H01R 24/86
(Continued)

FOREIGN PATENT DOCUMENTS

JP          6-140097 A    5/1994
JP      2001-203042 A    7/2001
(Continued)

OTHER PUBLICATIONS

International Search Report for PCT/JP2019/040520 dated Dec. 24, 2019 (PCT/ISA/210).

*Primary Examiner* — Mandeep S Buttar
(74) *Attorney, Agent, or Firm* — Sughrue Mion, PLLC (57) ABSTRACT

An electrical apparatus disclosed herein includes first/second electrical units configured to be fixed to each other. The first electrical unit has a first surface including a connector. The second electrical unit has a second surface facing the first surface of the first electrical unit. The second surface includes a socket configured to fit with the connector. One of the first and second electrical units includes a stud bolt extending toward the other of the first electrical unit and the second electrical unit, and the other of the first and second electrical units includes a bolt hole through which the stud bolt is configured to pass. When the second electrical unit is separated from the first electrical unit with the second surface facing the first surface, a bolt-hole distance from the stud bolt to the bolt hole is shorter than a connector-socket distance from the connector to the socket.

2 Claims, 7 Drawing Sheets

(58) Field of Classification Search
CPC .. H01R 13/627; H01R 13/207; H01R 13/057; H01R 13/113; H05K 1/141; H05K 1/144; H05K 7/023; H05K 7/026; H05K 2201/10409; H05K 7/1417; H05K 7/1427; H05K 7/1432
USPC .......................................................... 361/695
See application file for complete search history.

(56) References Cited

U.S. PATENT DOCUMENTS

| | | | |
|---|---|---|---|
| 2005/0176276 A1* | 8/2005 | Saka | H01R 13/629 439/76.2 |
| 2008/0136374 A1* | 6/2008 | Nelson | B60L 58/33 320/167 |
| 2019/0386477 A1* | 12/2019 | Fukuda | H01R 4/22 |
| 2019/0386577 A1* | 12/2019 | Ishii | H05K 3/366 |
| 2023/0074900 A1* | 3/2023 | Martin | H05K 5/0065 |
| 2023/0118691 A1* | 4/2023 | Morimoto | B62D 5/0406 310/71 |

FOREIGN PATENT DOCUMENTS

| | | |
|---|---|---|
| JP | 2005-137116 A | 5/2005 |
| JP | 2012-105369 A | 5/2012 |

* cited by examiner

ELECTRICAL DEVICE

CROSS REFERENCE TO RELATED APPLICATIONS

This application is a National Stage of International Application No. PCT/JP2019/040520 filed Oct. 15, 2019.

TECHNICAL FIELD

The art disclosed herein relates to an electrical device in which a first electrical unit and a second electrical unit are joined.

BACKGROUND ART

There may be cases where several electrical units are joined to compose one electrical apparatus. Such electrical apparatuses are exemplified in Japanese Patent Application Publication Nos. 2005-137116 and 2012-105369.

SUMMARY OF INVENTION

A first electrical unit and a second electrical unit are electrically connected to each other and fixed to each other. When the first electrical unit is fixed to the second electrical unit, a connector of the first electrical unit (second electrical unit) fits into a socket of the second electrical unit (first electrical unit), by which the units are electrically connected to each other. If a position of the second electrical unit is displaced relative to the first electrical unit upon joining the first electrical unit and the second electrical unit, the connector does not fit into the socket. The present teachings provide a structure configured to allow a connector and a socket to easily fit with each other when a first electrical unit and a second electrical unit are joined.

An electrical device disclosed herein may comprise a first electrical unit and a second electrical unit configured to be fixed to each other. The first electrical unit has a first surface comprising a connector. The second electrical unit has a second surface that faces the first surface of the first electrical unit. The second surface comprises a socket configured to fit with the connector. One of the first electrical unit and the second electrical unit comprises a stud bolt extending toward the other of the first electrical unit and the second electrical unit, the other of the first electrical unit and the second electrical unit comprises a bolt hole through which the stud bolt is configured to pass. The first electrical unit and the second electrical unit are fixed to each other by attaching a nut to the stud bolt passed through the bolt hole.

In the electrical apparatus disclosed herein, when the second electrical unit is separated from the first electrical unit with the second surface facing the first surface, a bolt-hole distance from the stud bolt to the bolt hole is shorter than a connector-socket distance from the connector to the socket. That is, when the fist electrical unit and the second electrical unit are joined, the stud bolt enters into the bolt hole before the connector enters into the socket. The entrance of the stud bolt into the bolt hole allows the connector and the socket to be guided to appropriate positions. The stud bolt is different from an ordinary bolt, and is fixed by itself to one of the two units. The electrical apparatus disclosed herein is configured to easily align the connector and the socket by using the stud bolt and the bolt hole as guides for determining the positions of the connector and the socket.

In the electrical apparatus disclosed herein, one of the first electrical unit and the second electrical unit may comprise a positioning pin extending toward the other of the first electrical unit and the second electrical unit, and the other of the first electrical unit and the second electrical unit may comprise a positioning hole through which the positioning pin is configured to pass. A clearance (pin clearance) between the positioning pin and the positioning hole is smaller than a clearance (bolt clearance) between the stud bolt and the bolt hole. When the second electrical unit is separated from the first electrical unit with the second surface facing the first surface, a pin-hole distance from the positioning pin to the positioning hole is longer than the bolt-hole distance but shorter than the connector-socket distance. In such an electrical apparatus having the positioning pin and the positioning hole as mentioned above, when the first electrical unit and the second electrical unit are joined, the stud bolt firstly enters into the bolt hole, and the positions of the connector and the socket are thereby adjusted with the bolt clearance. When the second electrical unit is further brought closer to the first electrical unit, the positioning pin enters into the positioning hole. As a result of this, the positions of the connector and the socket are adjusted more precisely with the pin clearance. When the second electrical unit is further brought closer to the first electrical unit, a tip of the connector reaches the socket, by which the connector enters smoothly into the socket. By adding the positioning pin and the positioning hole, the positions of the connector and the socket are adjusted in two steps. That is, by adding the positioning pin and the positioning hole, the connector and the socket can be joined more smoothly.

Alternatively, in the electrical apparatus disclosed herein, the connector may include a tip portion and a base portion, wherein an outer diameter of the base portion is greater than an outer diameter of the tip portion. Since the outer diameter of the base portion is greater than the outer diameter of the tip portion, a clearance (tip portion clearance) between the tip portion and an inner diameter of the socket is greater than a clearance (base portion clearance) between the base portion and the inner diameter. In that case, when the second electrical unit is separated from the first electrical unit with the second surface facing the first surface, the pin-hole distance may be longer than the connector-socket distance but shorter than a distance from a boundary between the tip portion and the base portion to the socket.

According to the above configuration, before the thin tip portion reaches the socket, the stud bolt enters into the bolt hole, by which the positions of the connector and the socket are adjusted. At this occasion, the positioning pin has not reached the positioning hole. The connector and the socket have their positions adjusted with the bolt clearance. Since the bolt clearance is smaller than the tip portion clearance, the tip portion of the connector smoothly enters into the socket.

When the second electrical unit is further brought closer to the first electrical unit, before the base portion reaches the socket, the positioning pin enters into the positioning hole, by which the positions of the connector and the socket are adjusted with the pin clearance. Since the pin clearance is smaller than the base portion clearance, the base portion of the connector enters smoothly into the socket.

Instead of the connector including the tip portion and the base portion, the socket may include a tip portion and a base portion. An inner diameter of the base portion of the socket is smaller than an inner diameter of the tip portion of the socket. As a result of this, a clearance between the tip portion and the outer diameter of the connector is greater than a clearance between the base portion and the outer diameter. In that case, when the second electrical unit is separated from the first electrical unit with the second surface facing the first surface, the pin-hole distance may be longer than the connector-socket distance and shorter than a distance from a boundary between the tip portion and the base portion to the connector. According to such a structure also, same advantage as that of the connector having the tip portion and the base portion may be obtained.

Details of the art disclosed herein and further developments will be described in "Description of Embodiments" as below.

DESCRIPTION OF EMBODIMENTS

Figure 1:
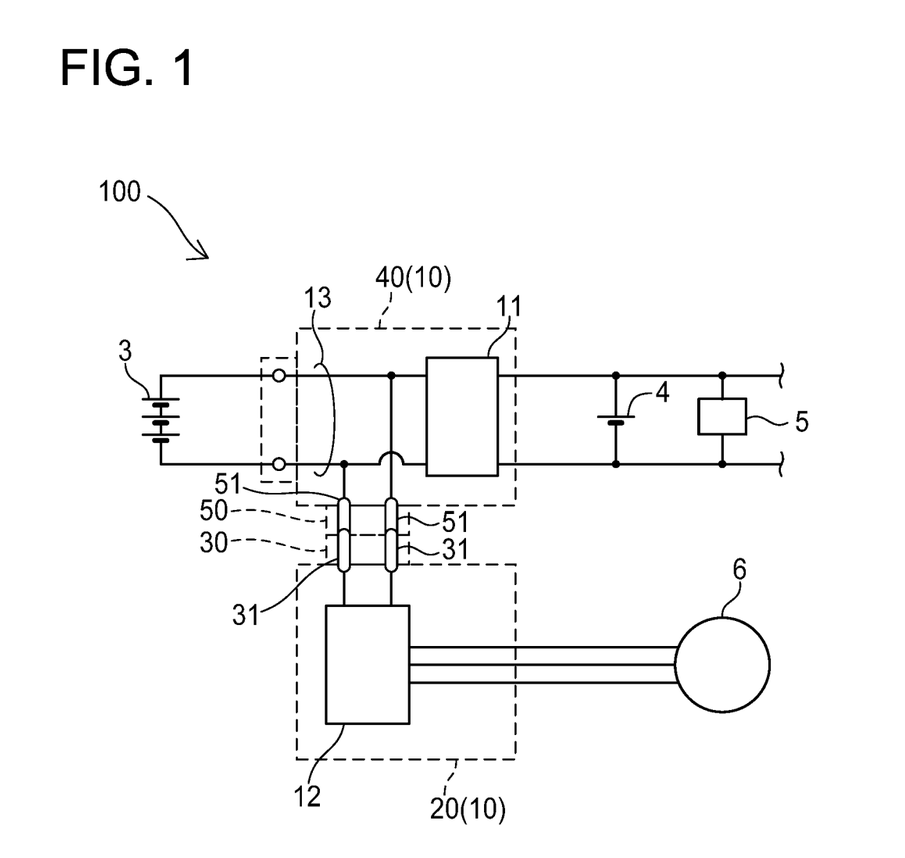
FIG. 1 is a block diagram of an electric vehicle containing an electrical apparatus (power converter) according to an embodiment.

An electrical apparatus according to an embodiment will be described with reference to drawings. The electrical apparatus according to the embodiment is a power converter 10 configured to be mounted in an electric vehicle. FIG. 1 illustrates a circuit diagram of a power system of an electric vehicle 100 including the power converter 10. The power converter 10 is configured to convert electric power of a main battery 3 into driving power of a traction motor 6 (electric traction motor for vehicle).

The power converter 10 is constituted of an inverter unit 20 and a voltage converter unit 40. Although this will be described in detail below, the inverter unit 20 and the voltage converter unit 40 are configured in separate casings, and these casings are fixed to each other.

A voltage converter circuit 11 is housed in the voltage converter unit 40. The voltage converter circuit 11 is connected to the main battery 3 as well as to an auxiliary battery 4. The main battery 3 has an output voltage of more than 100 volts, and the auxiliary battery 4 has an output voltage of 20 volts. The voltage converter circuit 11 is configured to step down the output voltage of the main battery 3 and supply power with the stepped-down voltage to the auxiliary battery 4. That is, the voltage converter circuit 11 is disposed for charging the auxiliary battery 4 with the power of the main battery 3. An accessory 5 is connected to the auxiliary battery 4. The accessory 5 is a generic term for apparatuses configured to operate by being powered by the auxiliary battery 4, such as a car stereo, an interior light, or a navigation device. A detailed explanation for the voltage converter circuit 11 is omitted.

An inverter circuit 12 is housed in the inverter unit 20. The inverter circuit 12 is configured to convert DC power of the main battery 3 into AC power, and supply the same to the traction motor 6.

The voltage converter unit 40 and the inverter unit 20 are electrically connected by a connector 30 and a socket 50. The inverter unit 20 comprises the connector 30, and the voltage converter unit 40 comprises the socket 50. The socket 50 comprises a pair of socket terminals 51. The pair of socket terminals 51 is connected to a pair of power lines 13 connecting the main battery 3 and the voltage converter circuit 11. The connector 30 comprises a pair of connector terminals 31. The pair of connector terminals 31 is connected to the inverter circuit 12 incorporated in the inverter unit 20. When the connector 30 has fitted with the socket 50, the socket terminals 51 and the connector terminals 31 are connected, by which the power of the main battery 3 can be supplied to the inverter circuit 12.

Figure 2:
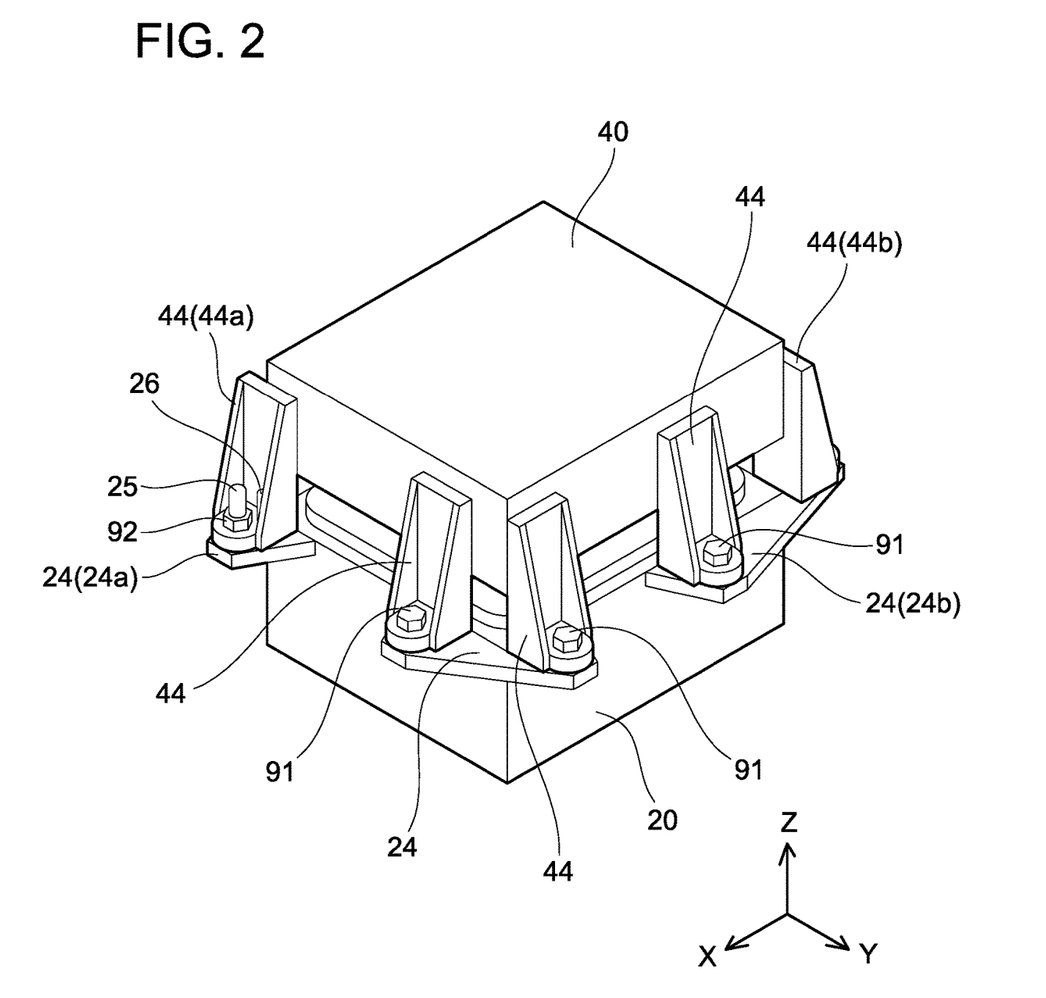
FIG. 2 is a perspective view of a power converter.
Figure 3:
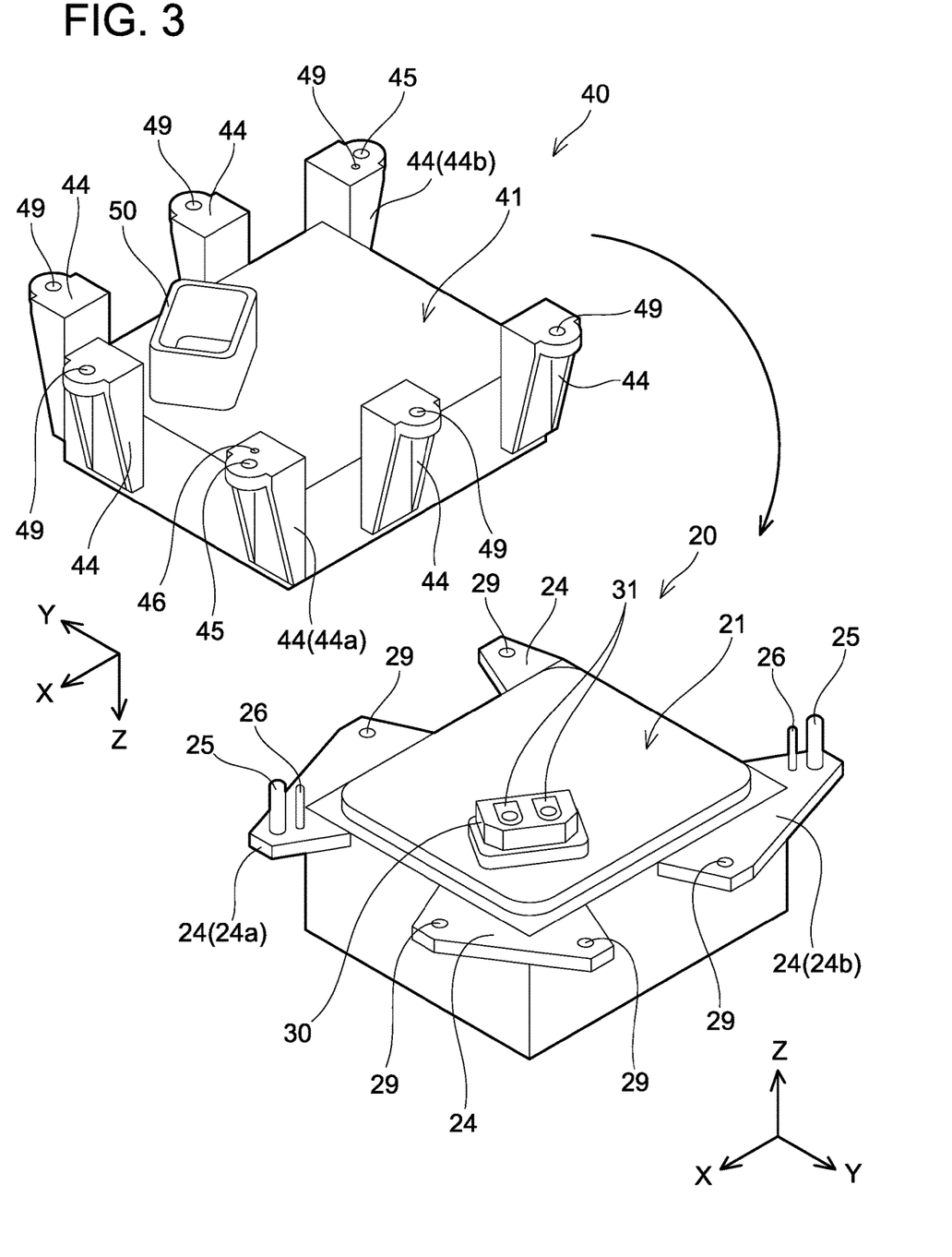
FIG. 3 is an exploded, perspective view of the power converter.

Next, hardware of the power converter 10 will be described. FIG. 2 illustrates a perspective view of the power converter 10. FIG. 3 illustrates an exploded perspective view in which the voltage converter unit 40 is separated from the inverter unit 20. For convenience of explanation, +Z direction in a coordinate system in the drawings will be defined as "up (upward)".

FIG. 3 depicts the voltage converter unit 40 up-side down. It should be noted that in FIG. 3, each of the voltage converter unit 40 and the inverter unit 20 is given its own coordinate system, and thus respective directions of their Z axes are reversed to each other.

The inverter unit 20 has side surfaces of its casing comprising a plurality of flanges 24. Each flange 24 comprises a through hole 29. Specific flanges (flange 24a and flange 24b) are each provided with a stud bolt 25 and a positioning pin 26. The stud bolt 25 and the positioning pin 26 are secured to each of the flanges 24a. 24b. The stud bolts 25 are respectively arranged at opposing corners of a rectangular upper surface 21 of the inverter unit 20, and the positioning pins 26 are also arranged at the opposing corners of the upper surface 21. The positioning pins (positioning holes) may be referred to as dowel pins (dowel holes).

The connector 30 which was described above is disposed on an upper surface 22 of the inverter unit 20. The connector terminals 31 are exposed on a top surface of the connector 30.

The voltage converter unit 40 has side surfaces of its casing comprising a plurality of legs 44. Each leg 44 comprises a through hole 49. Specific legs (legs 44a and 44b) are each provided with a bolt hole 45 and a positioning hole 46. The bolt hole 45 and the positioning hole 46 of the leg 44a (44b) are arranged at positions that face the stud bolt 25 and the positioning pin 26 of the flange 24a (24h) when the voltage converter unit 40 is assembled with the inverter unit 20.

The socket 50 which was described above is disposed on a lower surface 41 of the voltage converter unit 40. The socket 50 is arranged at a position that faces the connector 30 when the voltage converter unit 40 is assembled with the inverter unit 20. Although these are not shown as they are hiding in FIG. 3, the socket terminals 51, which were described above, are exposed on a bottom of the socket 50.

As shown in FIG. 2, when the voltage converter unit 40 is fixed to the inverter unit 20, the legs 44 of the voltage converter unit 40 face the flanges 24 of the inverter unit 20. Bolts 91 are allowed to pass respectively through the through holes 49 of the legs 44 and the through holes 29 of the flanges 24. Nuts (not shown) are attached to the bolts 91 passed through the through holes 29, 49, by which the legs 44 and the flanges 24, that is, the voltage converter unit 40 and the inverter unit 20 are fixed to each other.

The stud bolt 25 of the flange 24a(24b) is fixed by a nut 92 after it has passed through the bolt hole 45 of the leg 44a (44b). The positioning pin 26 of the flange 24a(24b) is allowed to pass through the positioning hole 46 of the leg 44a(44b).

When the voltage converter unit 40 is fixed to the inverter unit 20, the connector 30 fits with the socket 50 and the connector terminals 31 are connected to the socket terminals 51, by which the voltage converter unit 40 and the inverter unit 20 are electrically connected.

Figure 4:
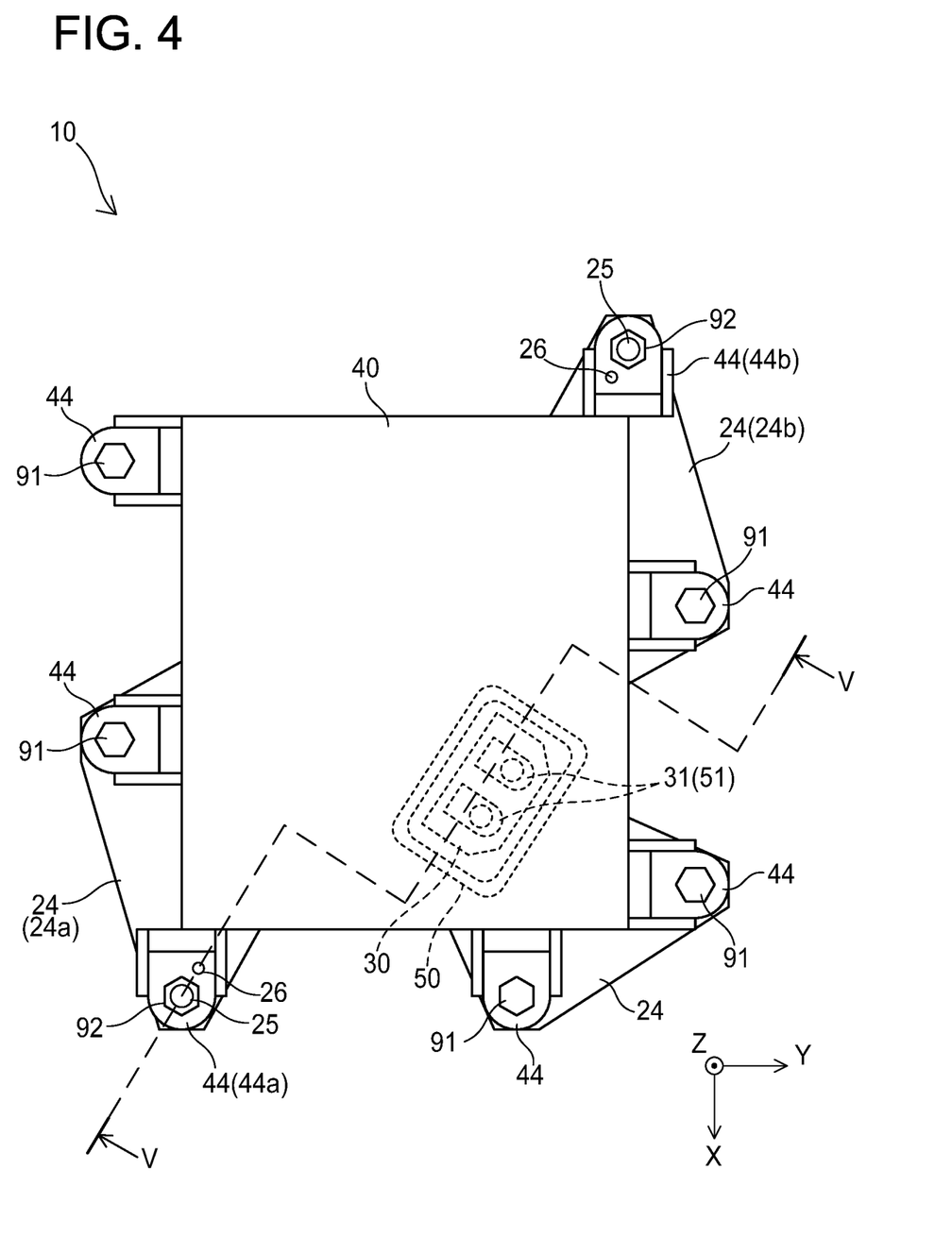
FIG. 4 is a plan view of the power converter.
Figure 5:
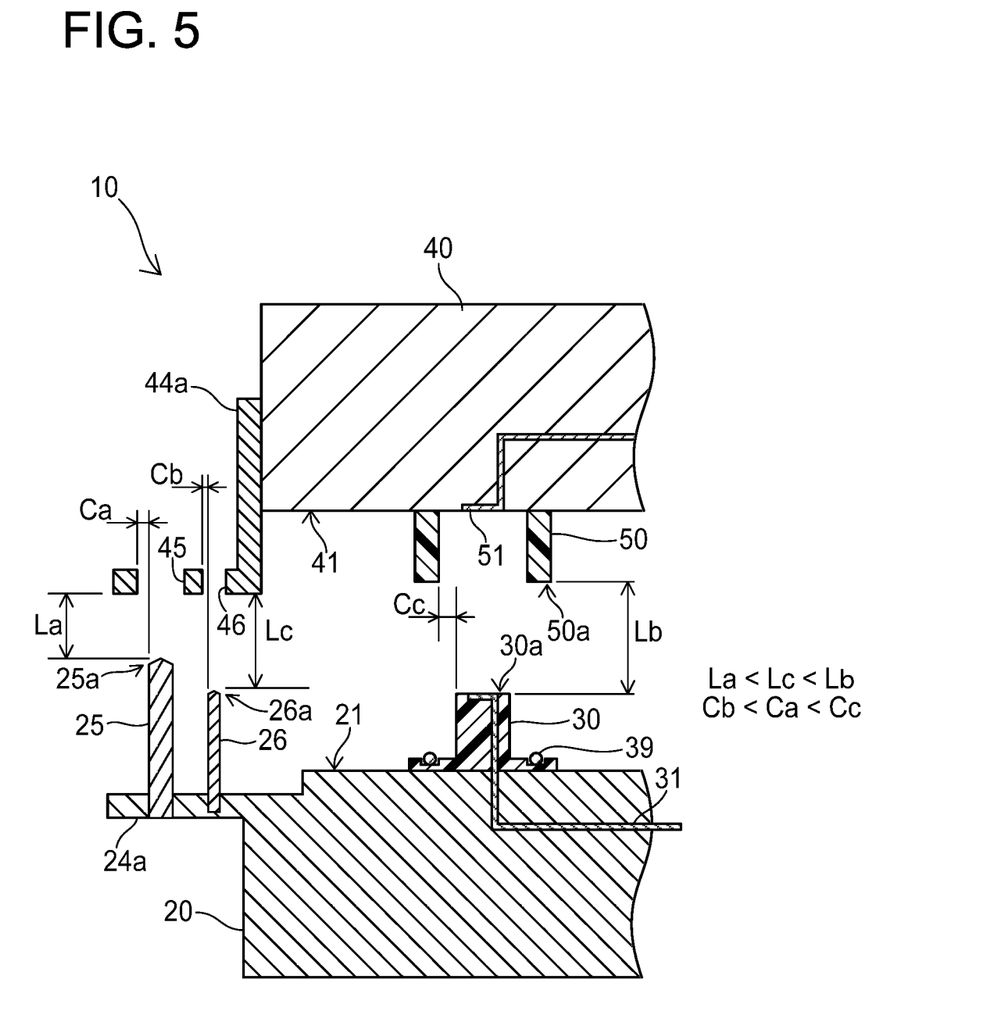
FIG. 5 is a cross-sectional view of the power converter as cut along a V-V line of FIG. 4 (in a state in which a voltage converter unit is separated from an inverter unit).

FIG. 4 illustrates a plan view of the power converter 10. In FIG. 4, the connector 30 and the socket 50 are shown in broken lines. A cross section as cut along a V-V line in FIG. 4 is shown in FIG. 5. FIG. 5 illustrates the cross section as cut in a plane traversing the stud bolt 25, the positioning pin 26, the connector 30, and the socket 50. FIG. 5 illustrates only one of the paired connector terminals 31 (and one of the paired socket terminals 51), and illustration of the other ones of those pairs is omitted. Further, in FIG. 5, an internal structure of the voltage converter unit 40, except the socket terminal 51, is not shown. Similarly, an internal structure of the inverter unit 20, except the connector terminal 31, is not shown.

With reference to FIG. 5, a geometrical relationship among the stud bolt 25, the positioning pin 26, the bolt hole 45, the positioning hole 46, the connector 30, and the socket 50 will be described. FIG. 5 illustrates a cross sectional view when the voltage converter unit 40 is separated from the inverter unit 20 with the lower surface 41 of the voltage converter unit 40 facing the upper surface 21 of the inverter unit 20. Further, FIG. 5 illustrates a relationship between the stud bolt 25 and the positioning pin 26 of the flange 24a, the bolt hole 45 and the positioning hole 46 of the leg 44a, the connector 30, and the socket 50. A relationship between the stud bolt 25 and the positioning pin 26 of the flange 24b, the bolt hole 45 and the positioning hole 46 of the leg 44b, the connector 30, and the socket 50 is also the same as the relationship shown in FIG. 5.

The connector 30 and the socket 50 are made of resin. The connector terminals 31 extend inside the connector 30. The socket 50 has a tubular structure, in which the socket terminals 51 are exposed on its bottom. When the connector 30 has entirely fitted with the socket 50, the connector terminals 31 are connected to the socket terminals 51. Although not shown, the connector terminals 31 and the socket terminals 51 are screwed together.

A distance from a tip 25a of the stud bolt 25 to the bolt hole 45 (bolt-hole distance La) is shorter than a distance from a tip 30a of the connector 30 to a tip 50a of the socket 50 (connector-socket distance Lb) (La<Lb). Also, a distance from a tip 26a of the positioning pin 26 to the positioning hole 46 (pin-hole distance Lc) is longer than the bolt-hole distance La, but shorter than the connector-socket distance Lb (La<Lc<Lb).

A clearance between the stud bolt 25 and the bolt hole 45 (bolt clearance Ca) is smaller than a clearance between the connector 30 and the socket 50 (connector clearance Cc). Further, a clearance between the positioning pin 26 and the positioning hole 46 (pin clearance Cb) is smaller than the bolt clearance Ca. That is, a relationship Cb<Ca<Cc stands. Here, the bolt clearance Ca means a difference between an outer diameter of the stud bolt 25 and an inner diameter of the bolt hole 45. The pin clearance Cb means a difference between an outer diameter of the positioning pin 26 and an inner diameter of the positioning hole 46. The connector clearance Cc means a difference between an outer diameter of the connector 30 and an inner diameter of the socket 50.

According to the above geometrical relationship, when the voltage converter unit 40 is assembled with the inverter unit 20, the connector 30 fits with the socket 50 smoothly. That is, when the voltage converter unit 40 is brought close to the inverter unit 20, the stud bolt 25 is allowed to pass through the bolt hole 45 before the connector 30 reaches the socket 50. The connector 30 and the socket 50 approach each other with a distance being the bolt clearance Ca or smaller in a horizontal direction.

When the voltage converter unit 40 is brought further closer, the positioning pin 26 is allowed to pass through the positioning hole 46. Even when the positioning pin 26 has reached the positioning hole 46, the connector 30 has not yet reached the socket 50. At this occasion, the connector 30 and the socket 50 approach each other with a distance being the pin clearance Cb or smaller in the horizontal direction. The connector clearance Cc is significantly greater than the pin clearance Cb. When the voltage converter unit 40 is further brought closer to the inverter unit 20, therefore, the connector 30 can fit with the socket 50 smoothly. In the power converter 10 according to the embodiment, the connector 30 and the socket 50 can be easily aligned when the voltage converter unit 40 and the inverter unit 20 are joined.

A gasket 39 is disposed at a proximal end of the connector 30. When the connector 30 has entirely fitted with the socket 50, the tip 50a of the socket 50 abuts the gasket 39, by which the connector 30 and the socket 50 are sealed therebetween.

Figure 6:
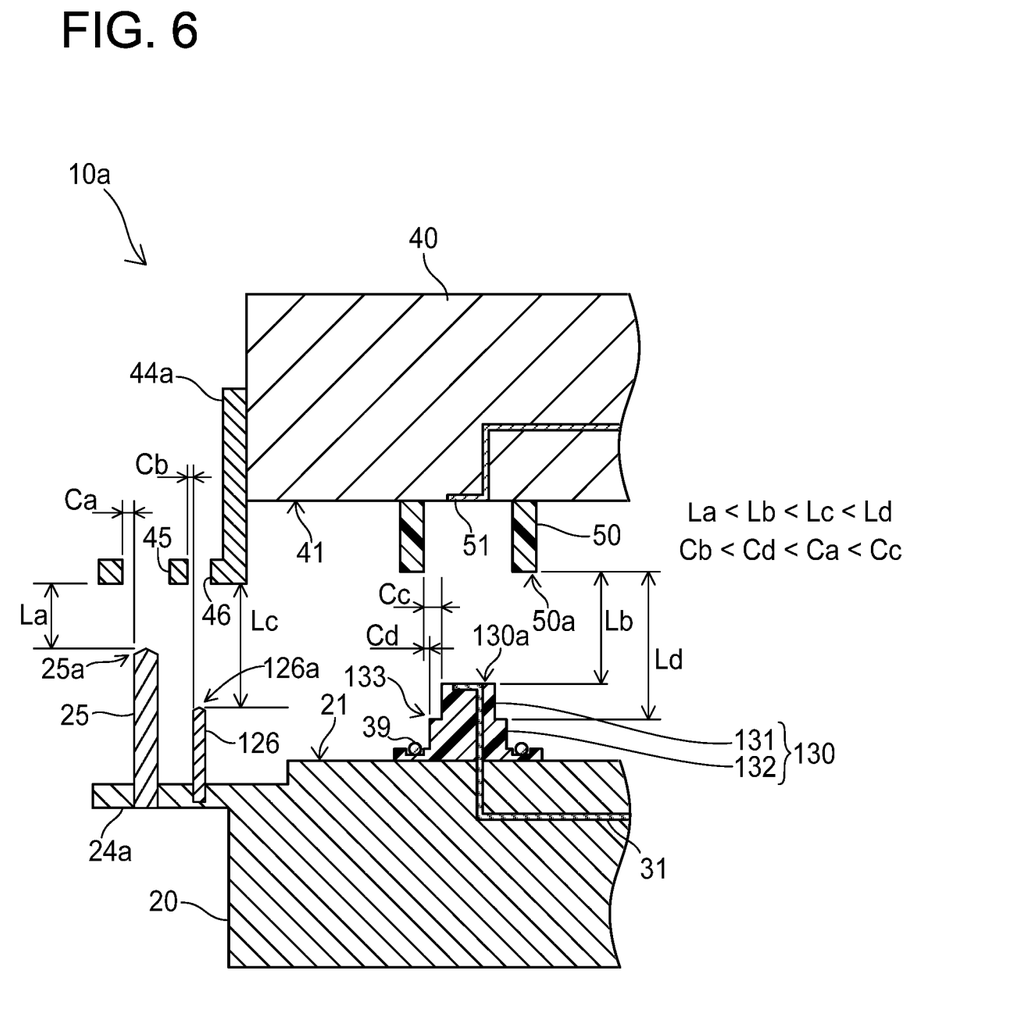
FIG. 6 is a cross-sectional view of a power converter according to a first variant (in a state in which a voltage converter unit is separated from an inverter unit).

(First Variant) Subsequently, a power converter 10a of a first variant will be described with reference to FIG. 6. FIG. 6 is a cross sectional view of the power converter 10a. The cross section of FIG. 6 corresponds to the cross section of FIG. 5.

The power converter 10a is different from the power converter 10 according to the embodiment about a shape of a connector 130 and a length of a positioning pin 126. The connector 130 is divided into a tip portion 131 and a base portion 132. The base portion 132 has an outer diameter greater than that of the tip portion 131. The outer diameter of the base portion 132 is slightly smaller than an inner diameter of the socket 50. The connector 130 and the socket 50 are both made of resin.

The power converter 10a has a following geometrical relationship when the voltage converter unit 40 is separated from the inverter unit 20 with the lower surface 41 of the voltage converter unit 40 facing the upper surface 21 of the inverter unit 20.

The distance from the tip 25a of the stud bolt 25 to the bolt hole 45 (bolt-hole distance La) is shorter than a distance from a tip 130a of the connector 130 to the tip 50a of the socket 50 (connector-socket distance Lb) (La<Lb). The distance from the tip 126a of the positioning pin 126 to the positioning hole 46 (pin-hole distance Lc) is longer than the connector-socket distance Lb (Lb<Lc). The pin-hole distance Lc is shorter than a distance from a boundary 133 between the tip portion 131 and the base portion 132 to the tip 50a of the socket 50 (boundary-socket distance Ld). That is, a relationship La<Lb<Lc<Ld stands.

Further, the clearance between the stud bolt 25 and the bolt hole 45 (bolt clearance Ca) is smaller than a clearance between the tip 130a of the connector 130 and the socket 50 (connector-tip clearance Cc). The bolt clearance Ca is greater than a clearance between the base portion 132 of the connector 130 and the socket 50 (connector base clearance Cd) (Cd<Ca). The connector base clearance Cd is greater than the clearance between the positioning pin 26 and the positioning hole 46 (pin clearance Cb). That is, a relationship Cb<Cd<Ca<Cc stands.

According to the geometrical relationship as aforementioned, when the voltage converter unit 40 is assembled with the inverter unit 20, the connector 130 fits with the socket 50 smoothly. That is, when the voltage converter unit 40 is brought close to the inverter unit 20, the stud bolt 25 is allowed to pass through the bolt hole 45 before the connector 130 reaches the socket 50. The connector 130 and the socket 50 approach each other with a distance being the bolt clearance Ca or smaller in the horizontal direction. When the voltage converter unit 40 is brought further closer to the inverter unit 20, the tip portion 131 of the connector 130 reaches the socket 50. At this occasion, the positioning pin 126 has not reached the positioning hole 46. Since the connector 130 and the socket 50 have already been brought closer with the distance being the bolt clearance Ca or smaller, however, the tip portion 131 enters into the socket 50 smoothly.

Because the bolt clearance Ca is greater than the connector base clearance Cd, the connector 130 cannot smoothly enter into the socket 50 as it is.

When the voltage converter unit 40 is brought further closer to the inverter unit 20, the positioning pin 126 reaches the positioning hole 46 before the tip 50a of the socket 50 reaches the boundary 133 of the connector 130. When the positioning pin 126 has entered into the positioning hole 46, the socket 50 and the connector 130 approach each other with the distance being the pin clearance Cb or smaller in the horizontal direction. Due to the relationship: pin clearance Cb<connector-base clearance Cd, when the voltage converter unit 40 is brought further closer to the inverter unit 20, the base portion 132 of the connector 130 can enter into the socket 50 smoothly.

In the power converter 10a of the first variant, when the voltage converter unit 40 and the inverter unit 20 are joined, the connector 30 and the socket 50 can be fitted with each other more smoothly.

A gasket 39 is disposed at a proximal end of the connector 130. When the connector 130 has entirely fitted with the socket 50, the tip 50a of the socket 50 abuts the gasket 39, by which the connector 130 and the socket 50 are sealed therebetween. The gasket may be disposed on an outer periphery of the base portion 132 of the connector 130.

Figure 7:
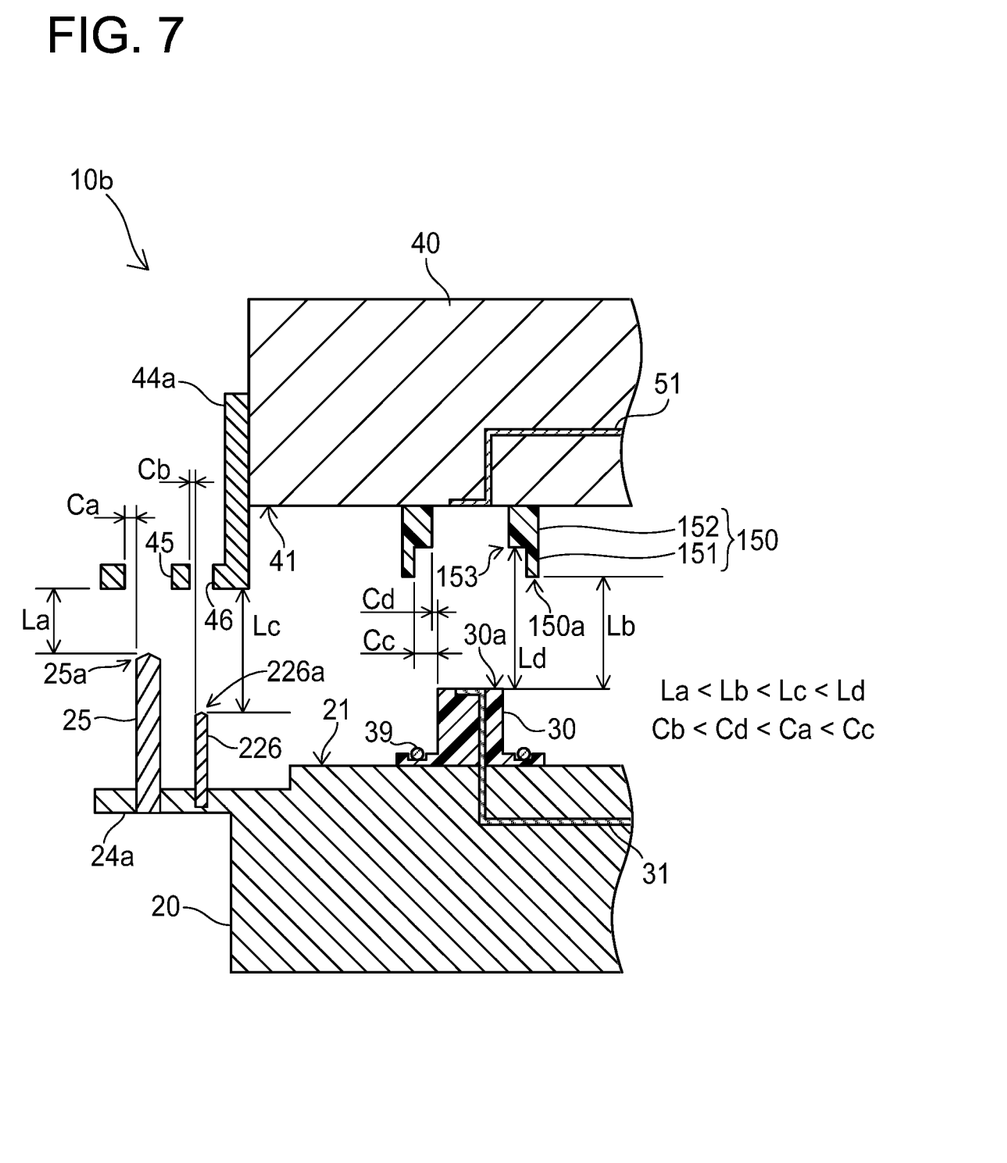
FIG. 7 is a cross-sectional view of a power converter according to a second variant (in a state in which a voltage converter unit is separated from an inverter unit).

(Second Variant) Next, a power converter 10b according to a second variant will be described with reference to FIG. 7. FIG. 7 is a cross sectional view of the power converter 10b. The cross section of FIG. 7 corresponds to the cross section in FIG. 5.

The power converter 10b is different from the power converter 10 according to the embodiment about a shape of a socket 150 and a length of a positioning pin 226. The connector 30 is the same as the connector 30 of the power converter 10 according to the embodiment. The socket 150 is divided into a tip portion 151 and a base portion 152. The socket 150 is tubular, and the base portion 152 has an inner diameter greater than that of the tip portion 151. The inner diameter of the base portion 152 is slightly greater than an outer diameter of the connector 30. The connector 30 and the socket 150 are both made of resin.

The power converter 10b has a following geometrical relationship when the voltage converter unit 40 is separated from the inverter unit 20 with the lower surface 41 of the voltage converter unit 40 facing the upper surface 21 of the inverter unit 20.

The distance from the tip 25a of the stud bolt 25 to the bolt hole 45 (bolt-hole distance La) is shorter than a distance (connector-socket distance Lb) from the tip 30a of the connector 30 to a tip 150a of the socket 150 (tip portion 151) (La<Lb). A distance from a tip 226a of the positioning pin 226 to the positioning hole 46 (pin-hole distance Lc) is longer than the connector-socket distance Lb (Lb<Lc). The pin-hole distance Lc is shorter than a distance from a boundary 153 between the tip portion 151 and the base portion 152 to the tip 30a of the connector 30 (connector-boundary distance Ld). That is, a relationship La<Lb<Lc<Ld stands.

Further, the clearance between the stud bolt 25 and the bolt hole 45 (bolt clearance Ca) is smaller than a clearance between the tip 151 of the socket 150 and the connector 30 (socket tip clearance Cc). The bolt clearance Ca is greater than a clearance between the base portion 152 of the socket 150 and the connector 30 (socket base clearance Cd) (Cd<Ca). The socket base clearance Cd is greater than a clearance between the positioning pin 226 and the positioning hole 46 (pin clearance Cb). That is, a relationship Cb<Cd<Ca<Cc stands.

According to the geometrical relationship, when the voltage converter unit 40 is assembled with the inverter unit 20, the connector 30 fits smoothly with the socket 150. That is, when the voltage converter unit 40 is brought close to the inverter unit 20, the stud bolt 25 is allowed to pass through the bolt hole 45 before the connector 30 reaches the socket 150. The connector 30 and the socket 150 approach each other with a distance being the bolt clearance Ca or smaller. When the voltage converter unit 40 is further brought closer to the inverter unit 20, the tip portion 151 of the socket 150 reaches the tip 30a of the connector 30. At this occasion, positioning pin 126 has not yet reached the positioning hole 46. Because the connector 30 and the socket 150 however have approached each other with the distance being the bolt clearance Ca or smaller in the horizontal direction, the connector 30 enters smoothly into the tip portion 151 of the socket 150.

Since the bolt clearance Ca is greater than the socket base clearance Cd, the connector 30 does not enter smoothly into the base portion 152 of the socket 150 as it is.

When the voltage converter unit 40 is further brought closer to the inverter unit 20, before the tip 30a of the connector 30 reaches the boundary 153 of the socket 150, the positioning pin 126 reaches the positioning hole 46. When the positioning pin 126 has entered the positioning hole 46, the socket 150 and the connector 30 approach each other with a distance being the pin clearance Cb or smaller. Since the pin clearance Cb<socket base clearance Cd, when the voltage converter unit 40 is further brought closer to the inverter unit 20, the connector 30 can enter smoothly into the base portion 152 of the socket 150.

Similarly to the power converter 10a of the first variant, the power converter 10b of the second variant is configured to allow the connector 30 and the socket 50 to fit with each other smoothly when the voltage converter unit 40 and the inverter unit 20 are joined.

A gasket 39 is disposed at a proximal end of the connector 30. When the connector 30 has entirely fitted with the socket 150, the tip 150a of the socket 150 abuts the gasket 39, by which the connector 30 and the socket 150 are sealed therebetween. The gasket may be disposed at an internal circumference of the base portion 152 of the socket 150.

Some points to be noted regarding the art explained in the embodiment will be described. The inverter unit 20 corresponds to an example of a first electrical unit, and the voltage converter unit 40 corresponds to an example of a second electrical unit. It is preferable that the art disclosed herein is applied to a combination of devices other than the voltage converter unit 40 and the inverter unit 20.

Specific examples of the present invention have been described in detail, however, these are mere exemplary indications and thus do not limit the scope of the claims. The art described in the claims includes modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. An electrical apparatus comprising:
a first electrical unit having a first surface comprising a connector; and
a second electrical unit configured to be fixed to the first electrical unit and having a second surface comprising a socket configured to fit with the connector, the second surface facing the first surface,
wherein one of the first electrical unit and the second electrical unit comprises a stud bolt extending toward the other of the first electrical unit and the second electrical unit, and
the other of the first electrical unit and the second electrical unit comprises a bolt hole through which the stud bolt is configured to pass,
wherein, when the second electrical unit is separated from the first electrical unit with the second surface facing the first surface, a bolt-hole distance from the stud bolt to the bolt hole is shorter than a connector-socket distance from the connector to the socket, wherein
the connector includes a tip portion and a base portion, wherein an outer diameter of the base portion is greater than an outer diameter of the tip portion, and
when the second electrical unit is separated from the first electrical unit with the second surface facing the first surface, the pin-hole distance is longer than the connector-socket distance but shorter than a distance from a boundary between the tip portion and the base portion to the socket.

2. An electrical apparatus comprising:
a first electrical unit having a first surface comprising a connector; and
a second electrical unit configured to be fixed to the first electrical unit and having a second surface comprising a socket configured to fit with the connector, the second surface facing the first surface,
wherein one of the first electrical unit and the second electrical unit comprises a stud bolt extending toward the other of the first electrical unit and the second electrical unit, and
the other of the first electrical unit and the second electrical unit comprises a bolt hole through which the stud bolt is configured to pass,
wherein, when the second electrical unit is separated from the first electrical unit with the second surface facing the first surface, a bolt-hole distance from the stud bolt to the bolt hole is shorter than a connector-socket distance from the connector to the socket, wherein
one of the first electrical unit and the second electrical unit comprises a positioning pin extending toward the other of the first electrical unit and the second electrical unit, and
the other of the first electrical unit and the second electrical unit comprises a positioning hole through which the positioning pin is configured to pass,
wherein
a clearance between the positioning pin and the positioning hole is smaller than a clearance between the stud bolt and the bolt hole, and
when the second electrical unit is separated from the first electrical unit with the second surface facing the first surface, a pin-hole distance from the positioning pin to the positioning hole is longer than the bolt-hole distance but shorter than the connector-socket distance, wherein
the socket includes a tip portion and a base portion, wherein an inner diameter of the base portion is smaller than an inner diameter of the tip portion, and
when the second electrical unit is separated from the first electrical unit with the second surface facing the first surface, the pin-hole distance is longer than the connector-socket distance but shorter than a distance from a boundary between the tip portion and the base portion to the connector.

* * * * *